US009997571B2

(12) United States Patent
So et al.

(10) Patent No.: US 9,997,571 B2
(45) Date of Patent: *Jun. 12, 2018

(54) METHOD AND APPARATUS FOR PROVIDING A CHARGE BLOCKING LAYER ON AN INFRARED UP-CONVERSION DEVICE

(71) Applicants: University of Florida Research Foundation, Inc., Gainesville, FL (US); Nanoholdings, LLC, Rowayton, CT (US)

(72) Inventors: Franky So, Gainesville, FL (US); Do Young Kim, Gainesville, FL (US); Dong Woo Song, Gainesville, FL (US); Galileo Sarasqueta, Chandler, AZ (US); Bhabendra K. Pradhan, Marietta, GA (US); Jae Woong Lee, Gainesville, FL (US)

(73) Assignees: University of Florida Research Foundation, Inc., Gainesville, FL (US); Nanoholdings, LLC, Rowayton, CT (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/247,130

(22) Filed: Apr. 7, 2014

(65) Prior Publication Data

US 2014/0367572 A1 Dec. 18, 2014

Related U.S. Application Data

(63) Continuation of application No. 13/114,896, filed on May 24, 2011, now Pat. No. 8,716,701.

(Continued)

(51) Int. Cl.
*G01J 5/20* (2006.01)
*H01L 27/28* (2006.01)
(Continued)

(52) U.S. Cl.
CPC ........ *H01L 27/288* (2013.01); *H01L 27/3227* (2013.01); *H01L 31/0296* (2013.01);
(Continued)

(58) Field of Classification Search
CPC ............. H01L 2251/308; H01L 31/101; H01L 51/5088; H01L 51/5056; H01L 51/50; H01L 51/5096
See application file for complete search history.

(56) References Cited

U.S. PATENT DOCUMENTS 4,614,958 A 9/1986 Mikami et al.
4,679,063 A 7/1987 White
(Continued)

FOREIGN PATENT DOCUMENTS

CN 1532959 A 9/2004
CN 1637628 A 7/2005
(Continued)

OTHER PUBLICATIONS

International Search Report and Written Opinion dated Jan. 4, 2012, in connection with Application No. PCT/US2011/037772.
(Continued)

*Primary Examiner* — Kenneth J Malkowski
(74) *Attorney, Agent, or Firm* — Wolf, Greenfield & Sacks, P.C.

(57) ABSTRACT

Embodiments of the invention are directed to an improved device for sensing infrared (IR) radiation with up-conversion to provide an output of electromagnetic radiation having a shorter wavelength than the incident IR radiation, such as visible light. The device comprises an anode, a hole blocking layer to separate an IR sensing layer from the anode, an organic light emitting layer that is separated from the anode by the IR sensing layer, and a cathode. The hole blocking layer assures that when a potential is applied
(Continued)

between the anode and the cathode the organic light emitting layer generates electromagnetic radiation only when the IR sensing layer is irradiated with IR radiation.

26 Claims, 7 Drawing Sheets

Related U.S. Application Data (60) Provisional application No. 61/347,696, filed on May 24, 2010.

(51) Int. Cl.
    *H01L 31/0232*      (2014.01)
    *H01L 31/102*      (2006.01)
    *H01L 27/32*      (2006.01)
    *H01L 31/0296*      (2006.01)
    *H01L 51/00*      (2006.01)
    *H01L 51/50*      (2006.01)
    *H01L 51/42*      (2006.01)

(52) U.S. Cl.
    CPC ...... *H01L 31/02322* (2013.01); *H01L 31/102* (2013.01); *H01L 51/0047* (2013.01); *H01L 51/0078* (2013.01); *H01L 51/4273* (2013.01); *H01L 51/5056* (2013.01); *H01L 51/5072* (2013.01); *H01L 51/5092* (2013.01); *H01L 51/5096* (2013.01); *Y02E 10/549* (2013.01)

(56) References Cited

U.S. PATENT DOCUMENTS

| | | | |
|---|---|---|---|
| 4,755,674 A | 7/1988 | Schaaf | |
| 4,778,692 A | 10/1988 | Ishihara et al. | |
| 4,885,211 A | 12/1989 | Tang et al. | |
| 5,121,398 A | 6/1992 | Rao | |
| 5,122,905 A | 6/1992 | Wheatley et al. | |
| 5,270,092 A | 12/1993 | Griffith et al. | |
| 5,315,129 A | 5/1994 | Forrest et al. | |
| 5,336,578 A | 8/1994 | Nukada et al. | |
| 5,389,788 A | 2/1995 | Grinberg et al. | |
| 5,438,198 A | 8/1995 | Ebitani et al. | |
| 5,619,039 A | 4/1997 | Montanari | |
| 5,710,428 A | 1/1998 | Ko | |
| 5,811,834 A | 9/1998 | Tamano et al. | |
| 6,140,646 A | 10/2000 | Busta et al. | |
| 6,509,574 B2 | 1/2003 | Yuan et al. | |
| 6,579,629 B1 | 6/2003 | Raychaudhuri et al. | |
| 6,734,452 B2 | 5/2004 | Gunapala et al. | |
| 6,777,961 B2 | 8/2004 | Hamamoto et al. | |
| 6,906,326 B2 | 6/2005 | Koch et al. | |
| 6,914,315 B2 | 7/2005 | Lai et al. | |
| 6,972,431 B2 | 12/2005 | Forrest et al. | |
| 7,247,850 B2 | 7/2007 | Laou et al. | |
| 7,270,586 B2 | 9/2007 | Tokailin et al. | |
| 7,279,705 B2 | 10/2007 | Iou | |
| 7,300,731 B2 | 11/2007 | Wang | |
| 7,381,953 B1 | 6/2008 | Kaufman | |
| 8,304,728 B2 | 11/2012 | So | |
| 8,405,028 B2 | 3/2013 | So | |
| 8,441,187 B2 | 5/2013 | Hunze et al. | |
| 8,507,865 B2 | 8/2013 | Boberl et al. | |
| 8,592,801 B2 | 11/2013 | So et al. | |
| 8,716,701 B2 | 5/2014 | So et al. | |
| 8,796,699 B2 | 8/2014 | So et al. | |
| 8,829,498 B2 | 9/2014 | So et al. | |
| 9,006,752 B2 | 4/2015 | So et al. | |
| 9,196,661 B2 | 11/2015 | So et al. | |
| 9,214,502 B2 | 12/2015 | So et al. | |
| 9,276,048 B2 | 3/2016 | So | |
| 2002/0027206 A1 | 3/2002 | Yuan et al. | |
| 2002/0066904 A1 | 6/2002 | Yuan et al. | |
| 2002/0130248 A1 | 9/2002 | Bretschneider et al. | |
| 2003/0122749 A1 | 7/2003 | Booth et al. | |
| 2003/0168599 A1 | 9/2003 | Liddiard | |
| 2003/0218166 A1 | 11/2003 | Tsutsui | |
| 2004/0016923 A1 | 1/2004 | Yu et al. | |
| 2004/0027059 A1 | 2/2004 | Tsutsui | |
| 2004/0031965 A1 | 2/2004 | Forrest et al. | |
| 2004/0135222 A1 | 7/2004 | Alfano et al. | |
| 2004/0222306 A1 | 11/2004 | Fajarillo | |
| 2004/0253759 A1 | 12/2004 | Garber et al. | |
| 2005/0077539 A1 | 4/2005 | Lipson | |
| 2005/0088079 A1 | 4/2005 | Daniels | |
| 2005/0088365 A1 | 4/2005 | Yamazaki et al. | |
| 2005/0110007 A1 | 5/2005 | Forrest et al. | |
| 2005/0137301 A1 | 6/2005 | Wu et al. | |
| 2005/0155641 A1 | 7/2005 | Fafard | |
| 2005/0156609 A1 | 7/2005 | Pfaff et al. | |
| 2005/0161703 A1 | 7/2005 | Costello | |
| 2005/0168137 A1 | 8/2005 | Adamovich et al. | |
| 2004/0818923 | 10/2005 | Barnes et al. | |
| 2005/0236556 A1 | 10/2005 | Sargent et al. | |
| 2006/0011927 A1 | 1/2006 | Ko | |
| 2006/0024526 A1 | 2/2006 | Thompson et al. | |
| 2006/0032528 A1* | 2/2006 | Wang | H01L 51/5052 136/263 |
| 2006/0043361 A1 | 3/2006 | Lee et al. | |
| 2006/0081840 A1 | 4/2006 | Mori et al. | |
| 2006/0084347 A1* | 4/2006 | Tutt | H01L 27/3211 445/24 |
| 2006/0097247 A1 | 5/2006 | Kim et al. | |
| 2006/0157806 A1 | 7/2006 | Rhodes | |
| 2006/0180197 A1 | 8/2006 | Gui et al. | |
| 2006/0186803 A1 | 8/2006 | Lim et al. | |
| 2006/0192125 A1 | 8/2006 | Yoganandan et al. | |
| 2006/0222979 A1 | 10/2006 | Ishida et al. | |
| 2006/0227531 A1 | 10/2006 | Iou | |
| 2006/0266998 A1 | 11/2006 | Vega et al. | |
| 2006/0290270 A1 | 12/2006 | Kim et al. | |
| 2007/0029482 A1 | 2/2007 | Laou et al. | |
| 2007/0048548 A1* | 3/2007 | Kim | H01L 51/5012 428/690 |
| 2007/0062576 A1 | 3/2007 | Duerr et al. | |
| 2007/0096085 A1 | 5/2007 | Rand et al. | |
| 2007/0116983 A1 | 5/2007 | Kanno et al. | |
| 2007/0129545 A1 | 6/2007 | Inoue et al. | |
| 2007/0176541 A1 | 8/2007 | Son et al. | |
| 2007/0215868 A1 | 9/2007 | Forrest et al. | |
| 2007/0216985 A1 | 9/2007 | Woodall et al. | |
| 2007/0221888 A1 | 9/2007 | Sakata | |
| 2007/0235753 A1 | 10/2007 | Debucquoy et al. | |
| 2008/0041447 A1 | 2/2008 | Tseng et al. | |
| 2008/0110499 A1 | 5/2008 | Chen et al. | |
| 2008/0138797 A1 | 6/2008 | Hunt et al. | |
| 2008/0142075 A1 | 6/2008 | Reddy et al. | |
| 2008/0223445 A1 | 9/2008 | Marks et al. | |
| 2008/0272713 A1 | 11/2008 | Kang et al. | |
| 2009/0045728 A1 | 2/2009 | Murano et al. | |
| 2009/0115310 A1 | 5/2009 | Yamamoto | |
| 2009/0140238 A1 | 6/2009 | Brabec et al. | |
| 2009/0152664 A1 | 6/2009 | Klem et al. | |
| 2009/0206237 A1 | 8/2009 | Shannon et al. | |
| 2009/0206745 A1 | 8/2009 | Hwang et al. | |
| 2009/0208776 A1 | 8/2009 | Liu et al. | |
| 2009/0214967 A1 | 8/2009 | Iwanaga et al. | |
| 2009/0217967 A1 | 9/2009 | Hovel et al. | |
| 2009/0223566 A1 | 9/2009 | Mitsui et al. | |
| 2009/0286338 A1 | 11/2009 | Coe-Sullivan et al. | |
| 2009/0301556 A1 | 12/2009 | Kawano et al. | |
| 2009/0321726 A1 | 12/2009 | Thompson | |
| 2010/0025662 A1 | 2/2010 | Cho et al. | |
| 2010/0044676 A1 | 2/2010 | Sargent et al. | |
| 2010/0044767 A1 | 2/2010 | Chaudhry et al. | |
| 2010/0059097 A1 | 3/2010 | McDonald et al. | |
| 2010/0133418 A1 | 6/2010 | Sargent et al. | |
| 2010/0133434 A1 | 6/2010 | Meng et al. | |
| 2010/0133522 A1 | 6/2010 | Pieh et al. | |
| 2010/0141122 A1 | 6/2010 | Begley et al. | |
| 2010/0181552 A1 | 7/2010 | So | |
| 2010/0229921 A1 | 9/2010 | Farris et al. | |

(56) References Cited

U.S. PATENT DOCUMENTS

| | | | |
|---|---|---|---|
| 2010/0233842 A1 | 9/2010 | Grein et al. | |
| 2010/0243053 A1 | 9/2010 | Coe-Sullivan et al. | |
| 2010/0282309 A1 | 11/2010 | Pschirer et al. | |
| 2010/0294936 A1 | 11/2010 | Boeberl et al. | |
| 2010/0302419 A1 | 12/2010 | Den Boer et al. | |
| 2010/0326506 A1 | 12/2010 | Lifshitz et al. | |
| 2011/0012091 A1* | 1/2011 | Forrest | B82Y 10/00 257/40 |
| 2011/0031399 A1 | 2/2011 | So | |
| 2011/0031403 A1 | 2/2011 | So | |
| 2011/0049489 A1 | 3/2011 | Forrest et al. | |
| 2011/0068330 A1 | 3/2011 | Akimoto et al. | |
| 2011/0079706 A1 | 4/2011 | Michalewicz | |
| 2011/0114921 A1 | 5/2011 | Yang et al. | |
| 2011/0140075 A1 | 6/2011 | Zhou et al. | |
| 2011/0248249 A1 | 10/2011 | Forrest et al. | |
| 2011/0303906 A1 | 12/2011 | Goldman | |
| 2012/0068140 A1 | 3/2012 | Greenham et al. | |
| 2012/0126204 A1 | 5/2012 | So et al. | |
| 2012/0187295 A1 | 7/2012 | So et al. | |
| 2012/0193689 A1 | 8/2012 | Park et al. | |
| 2012/0241723 A1 | 9/2012 | Klem et al. | |
| 2012/0286296 A1 | 11/2012 | So et al. | |
| 2013/0044250 A1 | 2/2013 | Senda et al. | |
| 2013/0206988 A1 | 8/2013 | So | |
| 2014/0060613 A1 | 3/2014 | So et al. | |
| 2014/0111652 A1 | 4/2014 | So et al. | |
| 2014/0217284 A1 | 8/2014 | So et al. | |
| 2014/0353502 A1 | 12/2014 | So et al. | |
| 2015/0001395 A1 | 1/2015 | So et al. | |
| 2015/0372046 A1 | 12/2015 | Kim et al. | |

FOREIGN PATENT DOCUMENTS

| | | | |
|---|---|---|---|
| CN | 1773732 A | 5/2006 | |
| CN | 1806343 A | 7/2006 | |
| CN | 1856888 A | 11/2006 | |
| CN | 101340749 A | 1/2009 | |
| CN | 101405888 A | 4/2009 | |
| CN | 101421664 A | 4/2009 | |
| CN | 101558348 A | 10/2009 | |
| CN | 101794834 A | 8/2010 | |
| CN | 101872793 A | 10/2010 | |
| CN | 102725616 A | 10/2012 | |
| EP | 0508970 A1 | 10/1992 | |
| EP | 0 848 433 A2 | 6/1998 | |
| EP | 0569257 B1 | 6/2002 | |
| EP | 1 351 558 A1 | 10/2003 | |
| EP | 1 498 960 A2 | 1/2005 | |
| JP | S60-030163 A | 2/1985 | |
| JP | S61-149831 A | 7/1986 | |
| JP | S63-088872 A | 4/1988 | |
| JP | S64-012583 A | 1/1989 | |
| JP | H02-016421 A | 1/1990 | |
| JP | H03-079693 A | 4/1991 | |
| JP | H07-122762 A | 5/1995 | |
| JP | H07-175420 A | 7/1995 | |
| JP | H08-007096 A | 1/1996 | |
| JP | H08-007096 B2 | 1/1996 | |
| JP | 10-065200 A | 3/1998 | |
| JP | H10-242493 A | 9/1998 | |
| JP | 11-329736 A | 11/1999 | |
| JP | 2002-523904 A | 7/2000 | |
| JP | 2000-277265 A | 10/2000 | |
| JP | 2000-349365 A | 12/2000 | |
| JP | 2001-006876 A | 1/2001 | |
| JP | 2001-076882 A | 3/2001 | |
| JP | 2002-340668 A | 11/2002 | |
| JP | 2003-083809 A | 3/2003 | |
| JP | 2003-178887 A | 6/2003 | |
| JP | 2004-511911 A | 4/2004 | |
| JP | 2005-522005 A | 7/2005 | |
| JP | 2005-266537 A | 9/2005 | |
| JP | 2005-277113 A | 10/2005 | |
| JP | 2006-013103 A | 1/2006 | |
| JP | 2006-066395 A | 3/2006 | |
| JP | 2006-128437 A | 5/2006 | |
| JP | 2006-518110 A | 8/2006 | |
| JP | 2006-251555 A | 9/2006 | |
| JP | 2007-519237 A | 7/2007 | |
| JP | 2008-016831 A | 1/2008 | |
| JP | 2008-053736 A | 3/2008 | |
| JP | 2008-523615 A | 7/2008 | |
| JP | 2009-509129 A | 3/2009 | |
| JP | 2009-520358 A | 5/2009 | |
| JP | 2009-527108 A | 7/2009 | |
| JP | 2009-192919 A | 8/2009 | |
| JP | 2009-531837 A | 9/2009 | |
| JP | 2009-253173 A | 10/2009 | |
| JP | 2009-272528 A | 11/2009 | |
| JP | 2010-506386 A | 2/2010 | |
| JP | 2010-067802 A | 3/2010 | |
| JP | 2010-087205 A | 4/2010 | |
| JP | 2010-192931 A | 9/2010 | |
| JP | 2010-263030 A | 11/2010 | |
| JP | 2010-534409 A | 11/2010 | |
| JP | 2011-098948 A | 5/2011 | |
| JP | 2012-524991 A | 10/2012 | |
| JP | 2013-512439 A | 4/2013 | |
| TW | 200637425 A | 10/2006 | |
| TW | 200847449 A | 12/2008 | |
| TW | 201041203 A | 11/2010 | |
| WO | WO 02/099896 A1 | 12/2002 | |
| WO | WO 03/084292 A1 | 10/2003 | |
| WO | WO 2004/073082 A1 | 8/2004 | |
| WO | WO 2005/069387 A1 | 7/2005 | |
| WO | WO 2005/101530 A1 | 10/2005 | |
| WO | WO 2006/130717 A2 | 12/2006 | |
| WO | WO 2007/017475 A1 | 2/2007 | |
| WO | WO 2007/095386 A1 | 8/2007 | |
| WO | WO 2007/102051 A2 | 9/2007 | |
| WO | WO 2007/131126 A2 | 11/2007 | |
| WO | WO 2008042859 A2 * | 4/2008 | H01L 27/288 |
| WO | WO 2008/054845 A2 | 5/2008 | |
| WO | WO 2008/140601 A1 | 11/2008 | |
| WO | WO 2009/074993 A2 | 6/2009 | |
| WO | WO 2009/116511 A1 | 9/2009 | |
| WO | WO 2010/070563 A2 | 6/2010 | |
| WO | WO 2010/120393 A2 | 10/2010 | |
| WO | WO 2010/142947 A1 | 12/2010 | |
| WO | WO 2011/033974 A1 | 3/2011 | |
| WO | WO 2011/066396 A2 | 6/2011 | |
| WO | WO 2012/170457 A2 | 12/2012 | |
| WO | WO 2012/178071 A2 | 12/2012 | |
| WO | WO 2013/003850 A2 | 1/2013 | |

OTHER PUBLICATIONS

International Preliminary Report on Patentability dated Dec. 6, 2012, in connection with Application No. PCT/US2011/037772.

Chikamatsu et al., Light up-conversion from near-infrared to blue using a photoresponsive organic light-emitting device. Appl Phys Lett. 2002;81(4):769.

Kim et al., Organic infrared upconversion device. Adv Mater. May 25, 2010;22(20):2260-3. doi: 10.1002/adma.200903312.

Ni et al., Organic light-emitting diode with TiOPc layer—A new multifunctional optoelectronic device. Jpn J Appl Phys. 2001;40:L948-51. doi:10.1143/JJAP.40.L948.

U.S. Appl. No. 11/865,505, filed Oct. 1, 2007, So.

U.S. Appl. No. 14/763,394, filed Jul. 24, 2015, Kim et al.

U.S. Appl. No. 13/272,995, filed Oct. 13, 2011, So et al.

U.S. Appl. No. 14/124,136, filed Dec. 5, 2013, So et al.

U.S. Appl. No. 14/129,225, filed Mar. 27, 2014, So et al.

U.S. Appl. No. 14/009,945, filed Nov. 18, 2013, So et al.

PCT/US2007/080104, Jun. 25, 2008, International Search Report.

EP 10833930.0, Jul. 19, 2016, Extended European Search Report.

PCT/US2010/058015, Jul. 29, 2011, International Search Report and Written Opinion.

EP 14791448.5, Jul. 25, 2016, Extended European Search Report.

PCT/US2014/012722, Nov. 24, 2014, International Search Report and Written Opinion.

(56) References Cited

OTHER PUBLICATIONS

PCT/US2014/012722, Feb. 12, 2015, Third Party Observation.
EP 11843638.5, Nov. 3, 2014, Extended European Search Report.
PCT/US2011/056180, Mar. 6, 2012, International Search Report and Written Opinion.
EP 12797523.3, Apr. 20, 2015, Extended European Search Report.
PCT/US2012/040980, Jan. 29, 2013, International Search Report and Written Opinion.
EP 12804913.7, Feb. 4, 2015, Extended European Search Report.
PCT/US2012/045272, Jan. 7, 2013, International Search Report and Written Opinion.
PCT/US2011/056178, Mar. 19, 2012, International Search Report and Written Opinion.
PCT/US2012/026920, Nov. 23, 2012, International Search Report and Written Opinion.
EP 1276466.1, Sep. 8, 2014, Extended European Search Report.
PCT/US2012/031988, Oct. 31, 2012, International Search Report and Written Opinion.
Extended European Search Report mailed May 27, 2016 for Application No. EP 11787262.2.
International Search Report mailed Jun. 25, 2008 in connection with Application No. PCT/US2007/080104.
Extended European Search Report mailed Jul. 19, 2016 in connection with Application No. EP 10833930.0.
International Search Report and Written Opinion mailed Jul. 29, 2011 in connection with Application No. PCT/US2010/058015.
Extended European Search Report mailed Jul. 25, 2016 in connection with Application No. EP 14791448.5.
International Search Report and Written Opinion mailed Nov. 24, 2014 in connection with Application No. PCT/US2014/012722.
Third Party Observation mailed Feb. 12, 2015 in connection with Application No. PCT/US2014/012722.
Extended European Search Report mailed Nov. 3, 2014 in connection with Application No. EP 11843638.5.
International Search Report and Written Opinion mailed Mar. 6, 2012 in connection with Application No. PCT/US2011/056180.
Extended European Search Report mailed Apr. 20, 2015 in connection with Application No. EP 12797523.3.
International Search Report and Written Opinion mailed Jan. 29, 2013 in connection with Application No. PCT/US2012/040980.
Extended European Search Report mailed Feb. 4, 2015 in connection with Application No. EP 12804913.7.
International Search Report and Written Opinion mailed Jan. 7, 2013 in connection with Application No. PCT/US2012/045272.
International Search Report and Written Opinion mailed Mar. 19, 2012 in connection with Application No. PCT/US2011/056178.
International Search Report and Written Opinion mailed Nov. 23, 2012 in connection with Application No. PCT/US2012/026920.
Extended European Search Report mailed Sep. 8, 2014 in connection with Application No. EP 1276466.1.
International Search Report and Written Opinion mailed Oct. 31, 2012 in connection with Application No. PCT/US2012/031988.
[No Author Listed] OLED Display for Thermal Imaging Helmet, Military and Aerospace Electronics. Oct. 7, 2003. http://www.militaryaerospace.com/articles/2003/10/oled-display-for-thermal-imagin-helmut [last accessed Dec. 8, 2014]. 2 pages.
Ban et al., Near-infrared to visible light optical upconversion by direct tandem integration of organic light-emitting diode and inorganic photodetector. Appl Phys Lett. Feb. 27, 2007;90(9):93108.1-3.
Carlson et al., Amorphous silicon solar cell. Appl Phys Lett. 1976;28:671-3.
Chen et al., Near-infrared inorganic/organic optical upconverter with an external power efficiency of >100%. Adv Mater. Nov. 16, 2010;22(43):4900-4. doi: 10.1002/adma.201001946.
Chen et al., Near-infrared optical upconverter based on i-In0.53Ga0.47As/C60 photovoltaic heterojunction. Electron Lett. Jul. 2009;45(14):753-5.
Chikamatsu et al., Photoresponsive organic electroluminescent devices. J Photochem Photobiol A: Chem. Jun. 1, 2003;158(2-3):215-8.
Gong et al., High-Detectivity Polymer Photodetectors with Special Response from 300 nm to 1450 nm. Sci. Sep. 25, 2009;325:1665-7.
Gong et al., Semiconducting Polymer Photodetectors with Electron and Hole Blocking Layers: High Detectivity in the Near-Infrared. Sensors. Jul. 1, 2010;10:6488-96.
Im et al., Near-infrared photodetection based on PbS colloidal quantum dots/organic hole conductor. Org Electron. Jan. 4, 2010;11(4):696-9.
Kim et al., PbSe nanocrystal-based infrared-to-visible up-conversion device. Nano Lett. May 11, 2011;11(5):2109-13. doi: 10.1021/nl200704h. Epub Apr. 19, 2011. 5 pages.
Kim, Organic Photovoltaic Cells and Organic Up-Convertion Devices. University of Florida. Thesis. May 31, 2009. 84 pages.
Konstantatos et al., Solution-Processed Quantum Dot Photodetectors. Proc IEEE. Oct. 2009;97(10):1666-83.
Konstantatos, Sensitive solution-processed quantum dot photodetectors. PhD Thesis Graduate Dept of Electrical and Computer Engineering. University of Toronto. 2008:133 pages.
Lepnev et al., Two-diode organic light amplifiers/converters and peculiarities of photocurrent multiplaction. Synth Met. Apr. 5, 2006;156(7-8):624-32.
Luo et al., Optical upconverter with integrated heterojunction phototransistor and light-emitting diode. Appl Phys Lett. Feb. 2006;88(7):73501.1-3.
McDonald et al., Solution-processed PbS quantum dot infrared photodetectors and photovoltaics. Nat Mater. Feb. 2005;4:138-43. Supplementary Figure. 1 page.
Mustafa et al., Solution processed nickel oxide anodes for organic photovoltaic devices. Appl Phys Lett. 2014;104(6):e063302.1-5.
Overton, Detectors: Near-IR image uses quantum-dot-sensitized photodiodes. Laser Focus World. Sep. 2009:25-8.
Sarasqueta et al., Organic and inorganic blocking layers for solution-processed colloidal PbSe nanocrystal infrared photodetectors. Adv Funct Mater. 2011;21(1):167-71.
Sargent, Infrared Quantum Dots. Adv Mater. Mar. 8, 2005;17(5):515-22.
Wagner et al., Change of electrochemical impedance spectra (EIS) with time during CO-poisoning of the Pt-anode in a membrane fuel cell. J Power Science. Mar. 10, 2004;127(1-2):341-7.
Wang et al., Correlation between mechanical stress and optical properties of SiO2/Ta2O5 multilayer UV narrow-bandpass filters deposited by plasma ion-assisted deposition. Proc of SPIE. Aug. 2005;5870:58700e.1-9.
Xie et al., InAs/InP/ZnSe Core/Shell/Shell Quantum Dots as Near-Infrared Emitters: Bright, Narrow-Band, Non-Cadmium Containing, and Biocompatible. Nano Res. 2008;1:457-64.
Yang et al., Semiconductor infrared up-conversion devices. Prog Quant Electr. 2011;35:77-108.
Yase et al., Organic Light-emitting Devices with Photoresponsive Layer. Pacific Rim Conference on Lasers and Electro-Optics. Tokyo, Japan. Jul. 11-15, 2005;569-70.

\* cited by examiner

METHOD AND APPARATUS FOR PROVIDING A CHARGE BLOCKING LAYER ON AN INFRARED UP-CONVERSION DEVICE

CROSS-REFERENCE TO RELATED APPLICATION

The present application is a continuing application of U.S. patent application Ser. No. 13/114,896, filed May 24, 2011, which claims the benefit of U.S. Provisional Application Ser. No. 61/347,696, filed May 24, 2010, which is hereby incorporated by reference herein in its entirety, including any figures, tables, or drawings.

BACKGROUND OF INVENTION

Infrared (IR)-to-visible light up-conversion devices have attracted a great deal of research interest due to the potential application in night vision, range finding, security, and semiconductor wafer inspections. Early near infrared (NIR) up-conversion devices were mostly based on the heterojunction structure of inorganic semiconductors. These devices consist of two parts in series: one part for photodetection and another for luminescence. The up-conversion devices are mainly distinguished by the method of photodetection. Up-conversion efficiencies of these devices are generally low. For example, one NIR-to-visible light up-conversion device that integrates a light-emitting diode (LED) with a semiconductor based photodetector exhibits a maximum external conversion efficiency of 0.3%. A hybrid organic/inorganic up-conversion device, having an inorganic InGaAs/InP photodetector integrated with an organic light-emitting diode (OLED), exhibits an external conversion efficiency of only 0.25%. Such inorganic and hybrid up-conversion devices are expensive to fabricate and processes and their fabrication is not compatible with large area applications.

Ni et al., *Jpn. J. Appl. Phys.* 2001, 40, L948 and Chikamatsu et al. *Appl. Phys. Lett.* 2002, 81, 769 disclose all organic up-conversion devices by coupling fluorescent OLEDs with a titanyl phthalocyanine (TiOPc) photosensitive hole injection layer to exhibited NIR-to-blue and red-to-green up-conversion, respectively. These all organic up-conversion devices display very low conversion efficiencies (less than 0.05%). The photodetectors used in the up-conversion devices have low quantum efficiencies, as the organic sensitizer yield photogenerated excitons having low charge-dissociation efficiency and the fluorescent OLEDs exhibit external quantum efficiencies (EQEs) of less than 5%, resulting in the low overall up-conversion efficiencies.

BRIEF SUMMARY

Embodiments of the invention are directed to a device for sensing infrared (IR) radiation and providing an output of higher energy electromagnetic radiation that includes an anode, a hole blocking layer (HBL) that separates the anode from an IR sensing layer, an organic light emitting layer that is separated from the anode by the IR sensing layer, and a cathode. Holes and electrons combine in the organic photon emitting layer to generate electromagnetic radiation, upon applying a potential between the anode and the cathode, when IR radiation strikes the IR sensing layer. In specific embodiments, one or both of the anode and cathode is transparent. In specific embodiments, the anode can be made from a material selected from the following: ITO, IZO, ATO, AZO, and carbon nanotubes, and the cathode can be made from a material selected from the following: LiF/Al, Ag, Ca:Mg, LiF/Al/ITO, Ag/ITO, CsCO$_3$/ITO, and Ba/Al. The hole blocking layer can incorporate BCP, UGH2, BPhen, Alq$_3$, mCP, C$_{60}$, 3TPYMB, ZnO nanoparticles, and/or any combination thereof. The organic photon emitting layer can be made from a material selected from the following: MEH-PPV, Alq$_a$, and FIrpic. The IR photodetecting layer can be made from an organic material, such as SnPc, SnPc:C$_{60}$, AlPcCl, AlPcCl:C$_{60}$, TiOPc, or TiOPc:C$_{60}$, or it can be made from an inorganic material such as PbSe or PbS. In embodiments of the invention the device can include one or more charge transport layers made from materials such as TAPC, NPB, or TPD to transport holes, and/or 3TPYMB, BCP, BPhen, and Alq$_3$ to transport electrons.

BRIEF DESCRIPTION OF DRAWINGS

FIGS. 1A-1B show a schematic energy diagram of a prior art infrared-to-green light up-conversion device without any charge blocking layer, where

FIGS. 2A-2C show a schematic energy band diagram of an IR-to-green light up-conversion device with hole blocking layer according to an embodiment of the invention, where

DETAILED DISCLOSURE

High-efficiency organic light-emitting devices, such as organic light-emitting diodes (OLEDs) and high efficiency organic photodetectors, have been demonstrated and an all organic up-conversion device has been disclosed by the inventors where an OLED and an IR photodetector are integrated into one device. (see Kim et al., PCT Patent Application No. PCT/US2010/058015, filed Nov. 24, 2010 and Kim et al. *Adv. Mater.* 2010, 22, 2260-3, both of which are hereby incorporated by reference herein in their entirety and, in particular, are incorporated for their teachings of organic photodetectors and all organic up-conversion devices, for example, an organic light-emitting device, such as an OLED, and an IR photodetector integrated into one device). Because of their compatibility with lightweight rugged flexible plastic substrates, an all organic up-conversion device can permit applications unavailable to other more conventional technologies. Unfortunately, even in the absence of IR irradiation, an off state, organic up-conversion device can still give off visible light, due to the small difference between the work function of the anode and the highest occupied molecular orbit (HOMO) of the IR absorbing photodetector at low voltages.

Figure 1A:
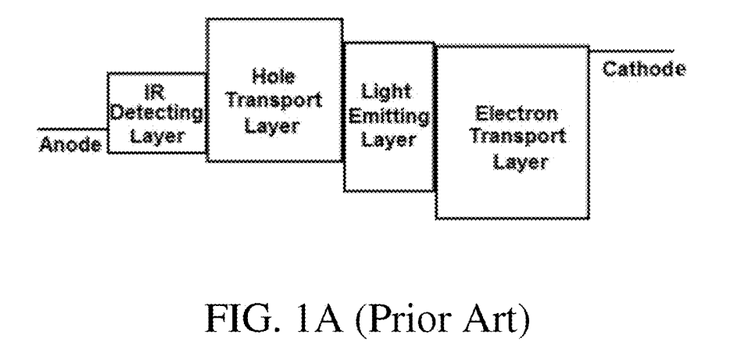
FIG. 1A shows the schematic energy band diagram under no applied voltage in the dark and FIG. 1B shows the schematic energy band diagram even under low applied voltage in the dark.

Embodiments of the invention are directed to improved infrared imaging devices where emission results from the up-conversion of an IR photodetector coupled with an organic light-emitting device, such as an OLED, where emission of light occurs only under IR irradiation at a sufficiently high voltage. Other embodiments of the invention are directed to a method of fabrication that is relatively low in cost and yields lightweight, highly sensitive devices with high gain and image fidelity while consuming little power. Specific embodiments can incorporate one or more of the organic IR-to-green light up-conversion devices disclosed in Kim et al., PCT/US2010/058015, or Kim et al. *Adv. Mater.* 2010, 22, 2260-3, where, in an exemplary embodiment, a tin phthalocyanine: buckminsterfullerene (SnPc:$C_{60}$) bulk heterostructure layer IR photodetector is connected in series with an fac-tris(2-phenylpyridine)iridium (Ir(ppy)$_3$) based phosphorescent layer as a light emitting layer, where the structure can be generalized by the structure diagrammed in FIG. 1A, which is similar to a conventional OLED.

Figure 1B:
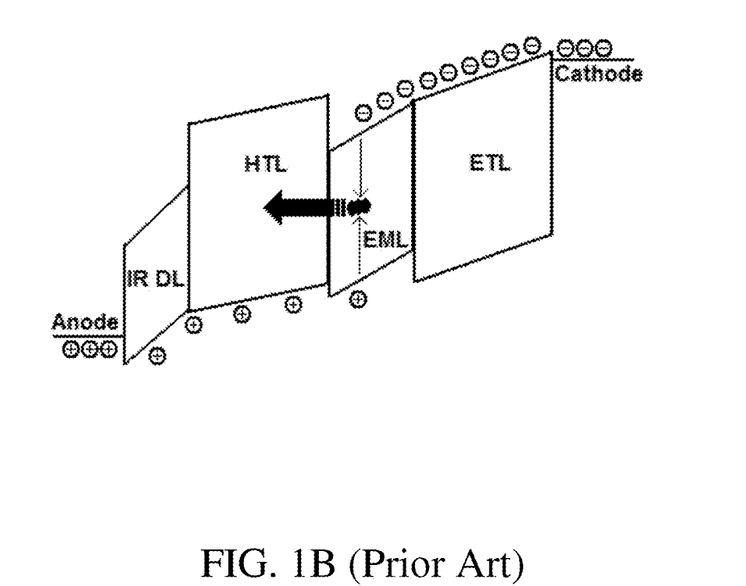

In an all-organic up-conversion device, it can be advantageous to have a poor hole transport IR-sensitizing layer such that the organic light-emitting device, such as an OLED, remains in the off state until IR irradiation occurs. Upon IR photo-excitation, holes are injected into the organic light emitting layer where the holes combine with electrons injected from the cathode to give off light of a shorter wavelength than the incident IR radiation, such as visible light. As in the case of a device with an indium-tin oxide (ITO) anode and IR detecting (absorbing) tin (II) phthalocyanine (SnPc) layer, due to the small difference between the anode's work function and the IR absorber's HOMO, hole injection from the anode occurs at low voltages, as illustrated in FIG. 1B. Hence, light can be generated, even with very little or no IR irradiation, with relatively low voltages applied to the electrodes.

Figure 2A:
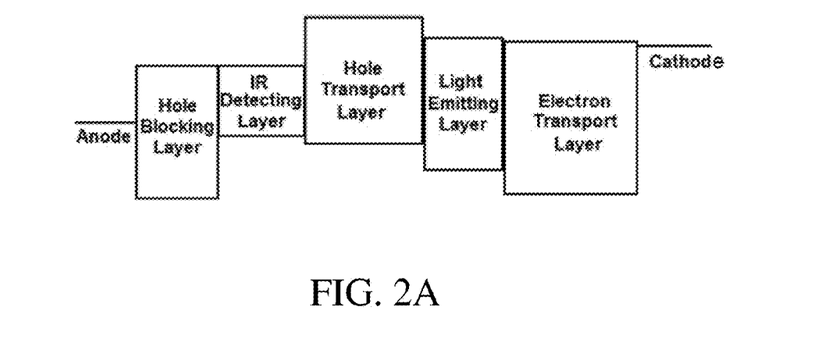
FIG. 2A shows the schematic energy band diagram under no applied voltage in the dark.
Figure 2B:
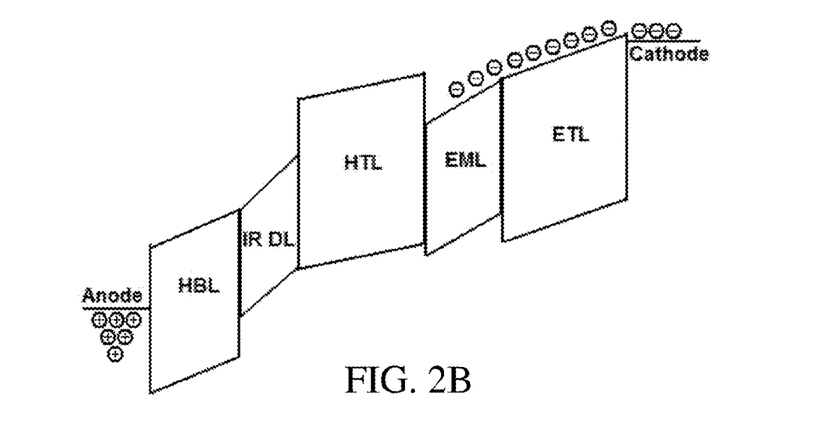
FIG. 2B shows the schematic energy band diagram even under high applied voltage in the dark.
Figure 2C:
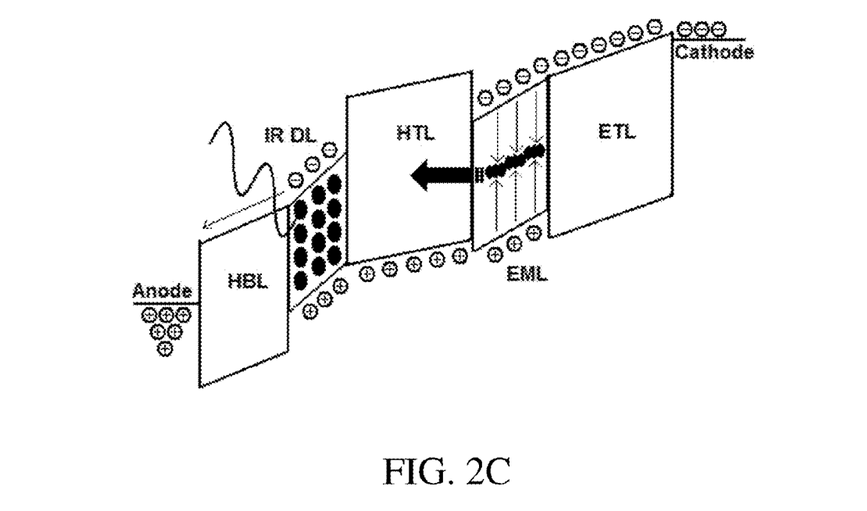
FIG. 2C shows the schematic energy band diagram under applied voltage in the IR irradiation.

In embodiments of the invention, the performance of an all organic up-conversion device is enhanced by inclusion of a charge blocking layer. In a specific embodiment, a hole blocking layer is placed between an ITO anode and a SnPc IR photodetecting layer, such that hole carriers from the ITO anode are efficiently blocked, suppressing visible luminance of the up-conversion device until a sufficiently high voltages and IR irradiation is applied, as shown in FIGS. 2A, 2B, and 2C. In addition to ITO, other materials that can be employed as an anode include, but are not limited to: Indium Zinc Oxide (IZO), Aluminum Tin Oxide (ATO), Aluminum Zinc Oxide (AZO), and carbon nanotube. In addition to SnPc:$C_{60}$, other organic IR photodetector materials that can be employed include, but are not limited to: tin (II) phthalocyanine (SnPc), aluminum phthalocyanine chloride (AlPcCl), AlPcCl:$C_{60}$, titanyl phthalocyanine (TiOPc), and TiOPc:$C_{60}$. In addition to Ir(ppy)$_3$, other electroluminescent organic light-emitting device, such as an OLED, materials that can be employed include, but are not limited to: poly-[2-methoxy, 5-(2'-ethyl-hexyloxy) phenylene vinylene] (MEH-PPV), tris-(8-hydroxy quinoline) aluminum (Alq$_3$), and iridium (III) bis[(4,6-di-fluorophenyl)-pyridinate-N,C2']picolinate (FIrpic). The cathode can be LiF/Al or can be any conductor with the appropriate work function including, but not limited to: Ag, Ca:Mg, LiF/Al/ITO, Ag/ITO, CsCO$_3$/ITO, and Ba/Al. Materials that can be employed as electron transport layers include, but are not limited to: tris[3-(3-pyridyl)-mesityl ]borane(3TPYMB), 2,9-Dimethyl-4,7-diphenyl-1,10-phenanthroline (BCP), 4,7-diphenyl-1,10-phenanthroline (BPhen), and tris-(8-hydroxy quinoline) aluminum (Alq$_3$). Materials that can be employed as hole transport layers include, but are not limited to: 1,1-bis [(di-4-tolylamino)phenyl]cyclohexane (TAPC), N,N'-diphenyl-N,N' (2-naphthyl)-(1,1'-phenyl)-4,4' -diamine (NPB), and N,N'-diphenyl-N,N'-di(m-tolyl) benzidine (TPD). Those skilled in the art can readily identify appropriate combinations of anodes, cathodes, IR photodetectors, organic light-emitting device, such as OLED, materials, hole transport layers, and electron transport layers by their relative work functions, highest occupied molecular orbit (HOMO) and lowest unoccupied molecular orbit (LUMO) levels, layer compatibility, and the nature of any desired deposition methods used during their fabrication.

Figure 3A:
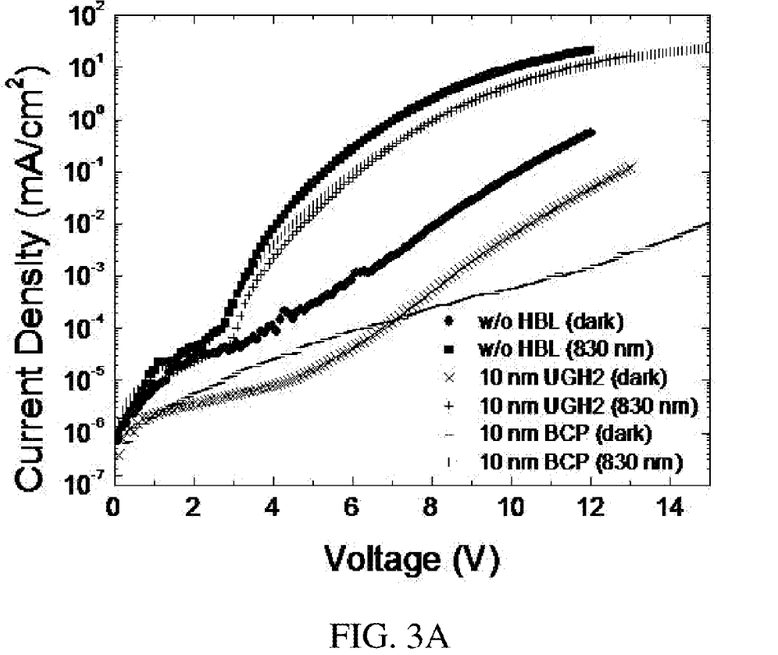
FIGS. 3A-3B show (3A) I-V characteristics and (3B) L-V characteristics of IR-to-green light up-conversion devices with various organic hole blocking layers according to embodiments of the invention with BCP and UGH2 as hole blocking materials under dark and IR irradiation.
Figure 3B:
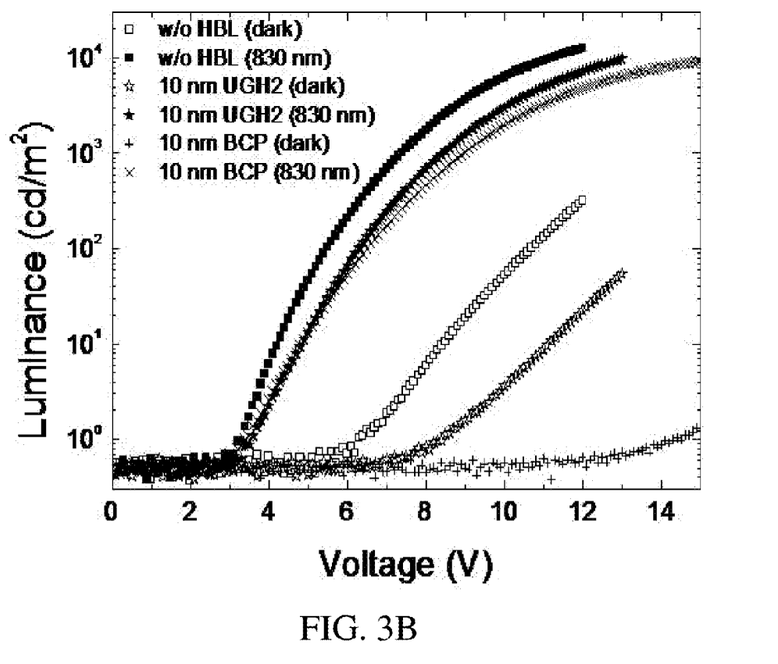

In some embodiments of the invention the hole blocking layer can be an organic compound. FIG. 3A shows I-V characteristics, and FIG. 3B shows L-V characteristics, of IR-to-green light up-conversion devices according to embodiments of the invention fabricated with different organic hole blocking layers, 2,9-Dimethyl-4,7-diphenyl-1, 10-phenanthroline (BCP) and p-bis(triphenylsilyly)benzene (UGH2), under dark and IR irradiation. These hole blocking materials possess deep HOMO levels. Because these materials also have small LUMO energy, charge generation between the hole blocking layer and the IR sensitizing layer is negligible. As illustrated in FIGS. 3A and 3B, up-conversion devices with a hole blocking layer have higher turn-on voltage in the dark. In addition to BCP and UGH2, other organic hole blocking layers that can be employed in embodiments of the invention include, but are not limited to: 4,7-diphenyl-1,10-phenanthroline (BPhen), tris-(8-hydroxy quinoline) aluminum (Alq$_3$), 3,5'-N,N'-dicarbazole-benzene (mCP), $C_{60}$, and tris[3-(3-pyridyl)-mesityl]borane (3TPYMB).

Figure 4A:
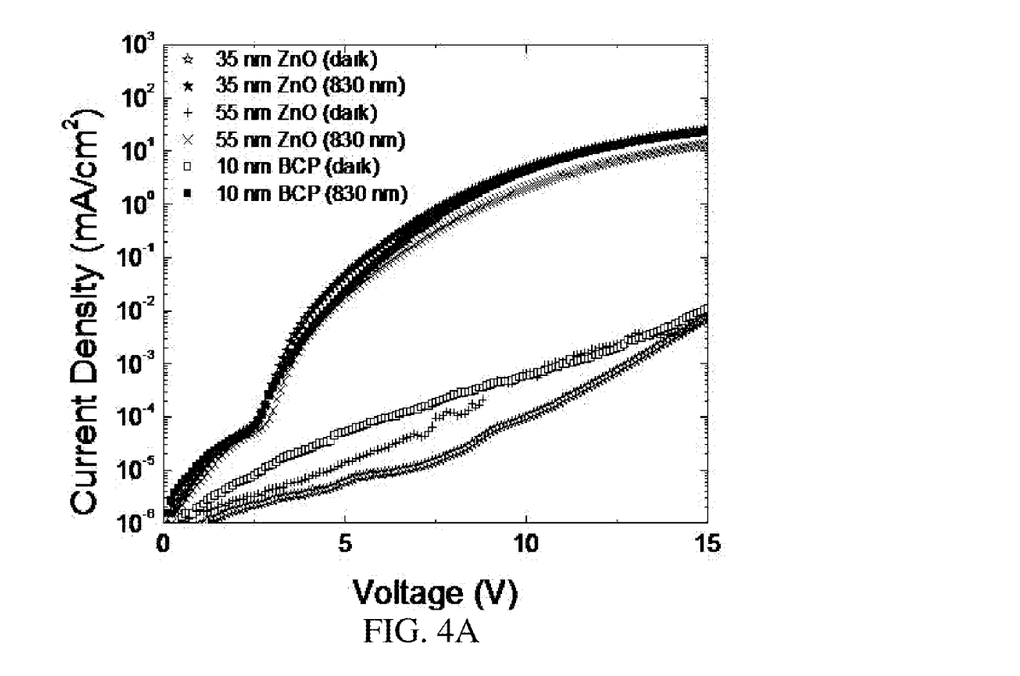
FIGS. 4A-4B show (4A) I-V characteristics and (4B) L-V characteristics of IR-to-green light up-conversion devices with inorganic ZnO hole blocking layers according to embodiments of the invention compared with a device having an organic BCP hole blocking layer according to an embodiment of the invention under dark and IR irradiation.
Figure 4B:
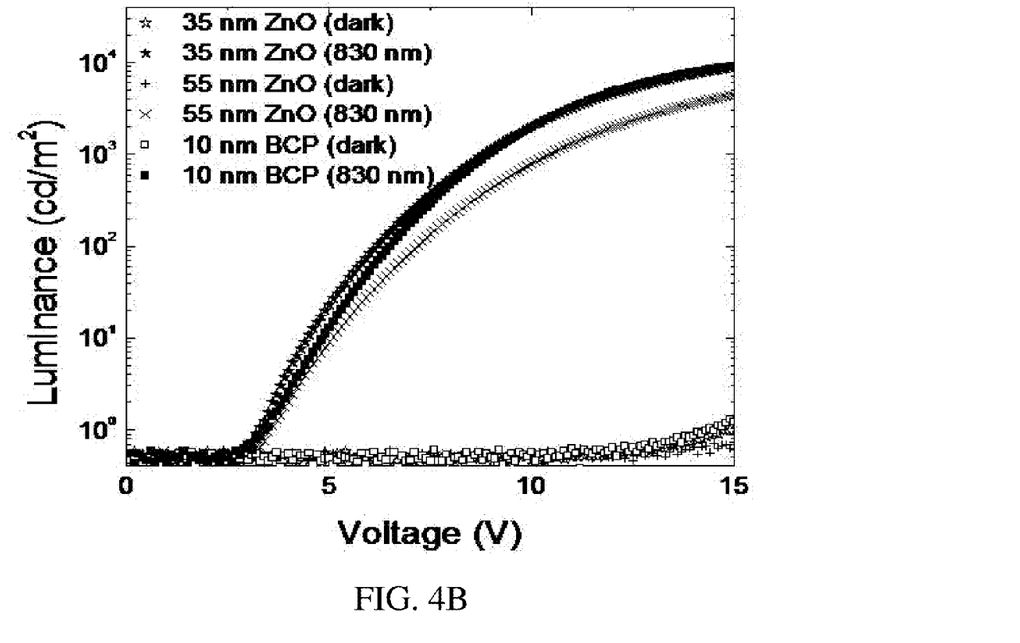

In other embodiments of the invention an inorganic hole blocking layer can be included in the up-conversion device. FIG. 4A shows the I-V characteristics and FIG. 4B shows the L-V characteristics of IR-to-green light up-conversion devices with differing thicknesses of ZnO hole blocking layers and, for comparison, a device with the organic BCP hole blocking layer under dark conditions and under IR irradiation. Devices with ZnO hole blocking layers display similar characteristics to that of BCP. In addition to ZnO, other inorganic hole blocking layers that can be employed in embodiments of the invention include, but are not limited to: TiO$_2$, SiO, SiO$_2$, Si$_3$N$_4$, and Al$_2$O$_3$. In some embodiments, the inorganic hole blocking layer can comprise a metal oxide. For example, in certain cases, the inorganic hole blocking layer can comprise an n-type semiconducting metal oxide. An n-type semiconducting metal oxide generally refers to a semiconducting metal oxide having a higher concentration of electrons than holes (e.g., the Fermi level lies closer to the conduction band than the valence band). Non-limiting examples of an n-type semiconducting metal oxide include ZnO and TiO$_2$. In certain embodiments, the n-type semiconducting metal oxide can be present in the up-conversion device in the form of a thin film. The thin film can, for example, be synthesized using a sol-gel process. The thin film can also be formed by other methods, including chemical vapor deposition, electron beam evaporation, and/or ion sputtering.

Figure 5A:
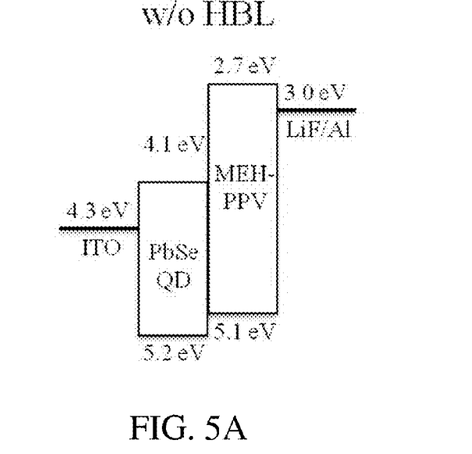
FIGS. 5A-5B show (5A) a schematic energy band diagram and (5B) L-I-V characteristics of a QD based IR-to-visible light up-conversion device without any charge blocking layer under dark and IR irradiation.
Figure 5B:
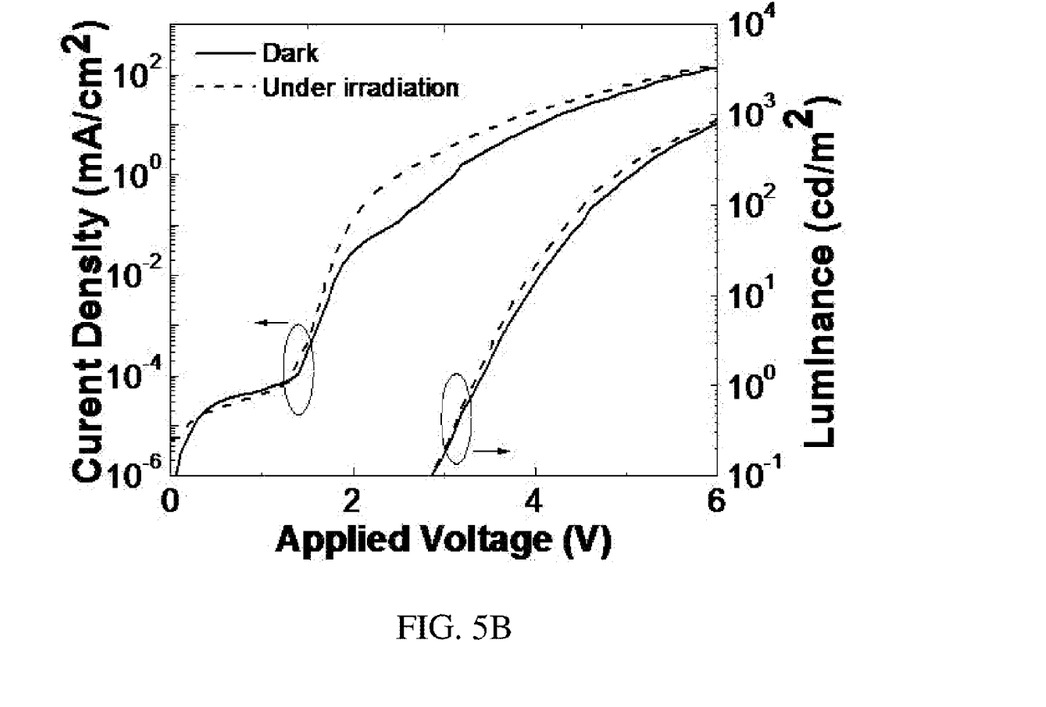
Figure 6A:
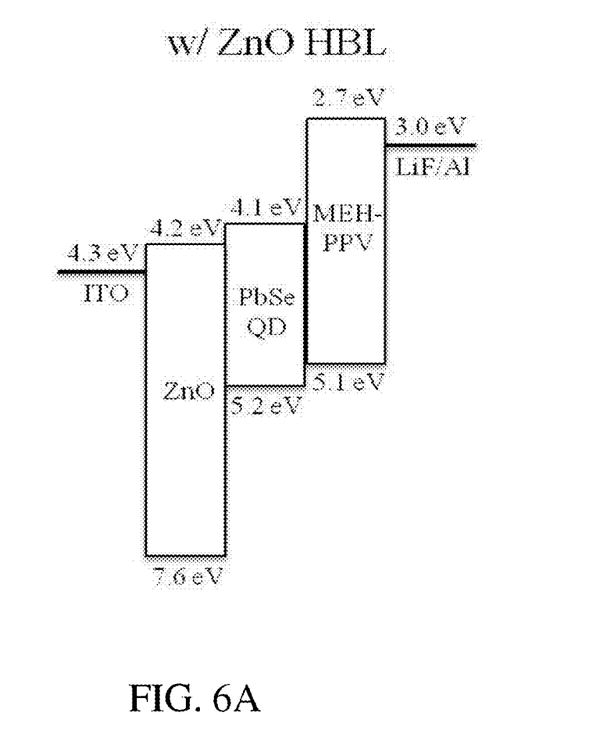
FIGS. 6A-6C show (6A) a schematic energy band diagram, (6B) I-V characteristics, and (6C) L-V characteristics of a QD based IR-to-visible light up-conversion device with ZnO hole blocking layer according to an embodiment of the invention under dark and IR irradiation.
Figure 6B:
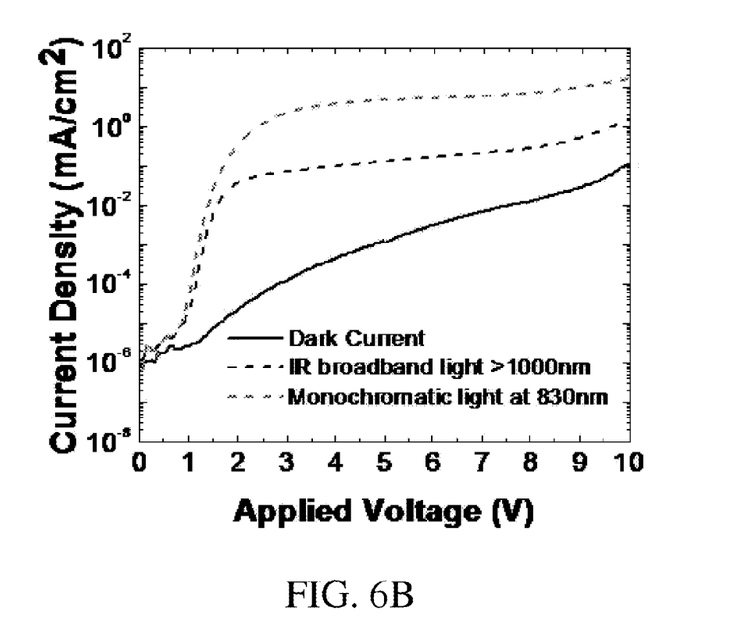
Figure 6C:
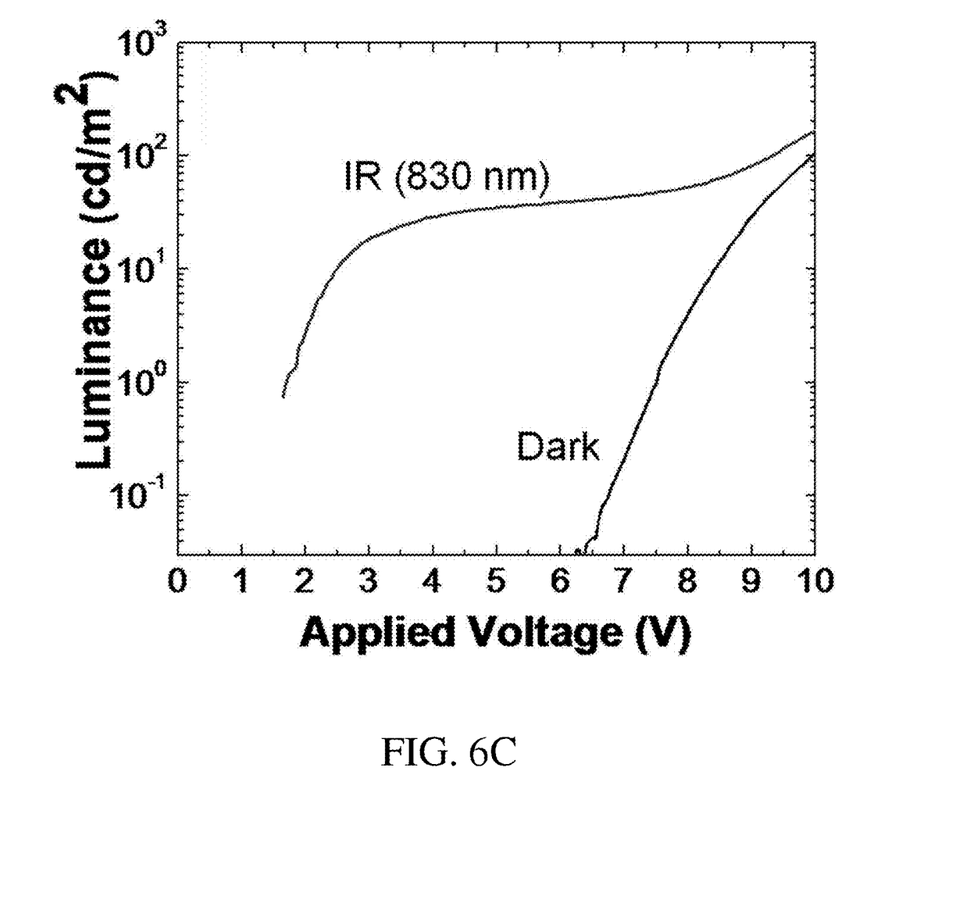

In another embodiment of the invention, the IR photodetecting layer can be inorganic, for example quantum dots (QDs) and the hole blocking layer can be organic or inorganic. For an exemplary up-conversion device lacking a hole blocking layer, shown in FIG. 5A, a layer of PbSe QDs is employed as the IR sensitizer and MEH-PPV is employed as the electroluminescent organic light-emitting device, such as an OLED. The device of FIG. 5A displayed no hole blocking by the QD IR detecting layer, as shown in FIG. 5B where the L-I-V characteristics on the QD IR up-conversion device displays little difference between dark and IR irradiated current densities and luminance with applied voltage, with luminescence occurring at a low voltage. In contrast, a QD IR up-conversion device with a ZnO hole blocking layer, as shown in FIG. 6A, effectively blocks hole injection from the anode in the dark. This is shown by the I-V and L-V characteristics in FIGS. 6B and 6C for a QD IR up-conversion device with a ZnO hole blocking layer. In this embodiment, IR irradiation acts as an effective optical switch. In addition to PbSe, other QDs that can be employed include, but are not limited to: PbS. Other inorganic materials that can be employed as IR detectors include, but are not limited to: Si, Ge, and GaAs.

Embodiments of the invention pertain to methods and apparatus for detecting infrared (IR) radiation and providing an output having a shorter wavelength than the incident IR radiation, such as a visible light output. Because of their compatibility with lightweight rugged flexible plastic substrates, up-conversion devices in accordance with embodiments of the present invention can be used as a component, for example a pixel, for numerous applications including, but not limited to, night vision, range finding, security, and semiconductor wafer inspections.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A device for sensing infrared (IR) radiation, comprising:
    an anode;
    a hole blocking layer comprising a metal oxide;
    an IR sensing layer separated from the anode by the hole blocking layer;
    an organic light emitting layer, separated from the anode by the IR sensing layer; and
    a cathode, wherein when a potential is applied between the anode and the cathode and IR radiation is incident on the IR sensing layer, electromagnetic radiation is generated in the organic light emitting layer.

2. The device according to claim 1, wherein the metal oxide is TiO2.

3. The device according to claim 1, wherein the metal oxide is ZnO.

4. The device according to claim 1, wherein the organic light emitting layer only generates the electromagnetic radiation when IR radiation is incident on the inorganic IR sensing layer.

5. The device according to claim 1, wherein the inorganic IR sensing layer comprises a material selected from the group consisting of: PbSe and PbS.

6. The device according to claim 1, further comprising a hole transport layer, wherein the hole transport layer separates the organic light emitting layer from the inorganic IR sensing layer.

7. The device according to claim 6, wherein the hole transport layer comprises a material selected from the group consisting of: TAPC, NPB, and TPD.

8. The device according to claim 1, further comprising an electron transport layer, wherein the electron transport layer separates the organic light emitting layer from the cathode.

9. The device of claim 8, wherein the electron transport layer comprises a material selected from the group consisting of: 3TPYMB, BCP, BPhen, and Alq3.

10. The device according to claim 1, wherein the electromagnetic radiation is generated in the organic light emitting layer via electrons injected from the cathode combining with holes injected from the IR sensing layer.

11. The device according to claim 10, wherein the electrons injected from the cathode travel through an electron transport layer from the cathode to the organic light emitting layer, and wherein the holes injected from the IR sensing layer travel through a hole transport layer from the IR sensing layer to the light emitting layer.

12. The device according to claim 1, wherein the electromagnetic radiation is not generated until the potential reaches a threshold magnitude.

13. The device according to claim 1, wherein charge generation between the hole blocking layer and the IR sensing layer is negligible.

14. A method of detecting infrared (IR) radiation, comprising:
    applying a potential between an anode and a cathode of a device in a region of interest, the device comprising:
        the anode;
        a hole blocking layer comprising a metal oxide;
        an inorganic IR sensing layer separated from the anode by the hole blocking layer;
        an organic light emitting layer, separated from the anode by the inorganic IR sensing layer; and
        the cathode;
    generating electromagnetic radiation in the organic light emitting layer in response to IR radiation incident on the inorganic IR sensing layer;: and
    determining that IR radiation is present in the region of interest when the electromagnetic radiation is detected.

15. The method according to claim 14, wherein the metal oxide is TiO2.

16. The method according to claim 14, wherein the metal oxide is ZnO.

17. The method according to claim 14, wherein the organic light emitting layer only generates the electromagnetic radiation when IR radiation is incident on the IR sensing layer.

18. The method according to claim 14, wherein the inorganic IR sensing layer comprises a material selected from the group consisting of: PbSe and PbS.

19. The method according to claim 14, wherein the device further comprises a hole transport layer, wherein the hole transport layer separates the organic light emitting layer from the IR sensing layer.

20. The method according to claim 19, wherein the hole transport layer comprises a material selected from the group consisting of: TAPC, NPB, and TPD.

21. The method according to claim 14, wherein the device further comprises an electron transport layer, wherein the electron transport layer separates the organic light emitting layer from the cathode.

22. The method of claim 21, wherein the electron transport layer comprises a material selected from the group consisting of: 3TPYMB, BCP, BPhen, and Alq3.

23. The method according to claim 14, wherein the electromagnetic radiation is generated in the organic light emitting layer via electrons injected from the cathode combining with holes injected from the IR sensing layer.

24. The method according to claim 23, wherein the electrons injected from the cathode travel through an electron transport layer from the cathode to the organic light emitting layer, and wherein the holes injected from the IR sensing layer travel through a hole transport layer from the IR sensing layer to the light emitting layer.

25. The method according to claim 14, wherein the electromagnetic radiation is not generated until the potential reaches a threshold magnitude.

26. The method according to claim 14, wherein charge generation between the hole blocking layer and the inorganic IR sensing layer is negligible.

* * * * *